United States Patent
Loiseau et al.

(10) Patent No.: US 11,349,304 B2
(45) Date of Patent: May 31, 2022

(54) STRUCTURE AND METHOD FOR CONTROLLING ELECTROSTATIC DISCHARGE (ESD) EVENT IN RESISTOR-CAPACITOR CIRCUIT

(71) Applicant: GLOBALFOUNDRIES U.S. INC., Santa Clara, CA (US)

(72) Inventors: Alain F. Loiseau, Williston, VT (US); Robert J. Gauthier, Jr., Williston, VT (US); Souvick Mitra, Essex Junction, VT (US); You Li, South Burlington, VT (US); Meng Miao, Williston, VT (US); Wei Liang, South Burlington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/082,182

(22) Filed: Oct. 28, 2020

(65) Prior Publication Data

US 2022/0131369 A1    Apr. 28, 2022

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC .............................. H02H 9/046; H01L 27/0248
USPC .......................................................... 361/56
See application file for complete search history.

(56) References Cited

U.S. PATENT DOCUMENTS

2013/0201586 A1 *  8/2013  Torres ................... H02H 9/046
                                                              361/56

OTHER PUBLICATIONS

Cao et al., " A Prolonged Discharge Time ESD Power-rail Clamp Circuit Structure with Strong Ability to Prevent False Triggering," IEEE 2016, 3 pages.

(Continued)

*Primary Examiner* — Dharti H Patel
(74) *Attorney, Agent, or Firm* — Francois Pagette (57) ABSTRACT

Embodiments of the disclosure provide a circuit structure and method to control electrostatic discharge (ESD) events in a resistor-capacitor (RC) circuit. Circuit structures according to the disclosure may include a trigger transistor coupled in parallel with the RC circuit, and a gate terminal coupled to part of the RC circuit. A mirror transistor coupled in parallel with the RC circuit transmits a current that is less than a current through the trigger transistor. A snapback device has a gate terminal coupled to a source or drain of the mirror transistor, and a pair of anode/cathode terminals coupled in parallel with the RC circuit. A current at the gate terminal of the snapback device, derived from current in the mirror transistor, controls an anode/cathode current flow in the snapback device.

18 Claims, 4 Drawing Sheets

(56) References Cited

OTHER PUBLICATIONS

Liu et al., "Design of Power-Rail ESD Clamp Circuit with Separate Detection Component and Delay Component Against Mistriggering," IEEE 2013, 2 pages.
Lu et al., "A Power Clamp Circuit Using Current Mirror for On-chip ESD Protection," IEEE 2012, 3 pages.
Lu et al., "Design and Verification of a Novel Multi-RC-triggered Power Clamp Circuit for On-chip ESD Protection," EEE, downloaded Jun. 16, 2020, 7 pages.
Xiaozong et al., "ESD Clamp Protection Structure with Current Mirror Trigger Circuit in Submicron CMOS Technology," IEEE 2014, 3 pages.

\* cited by examiner

STRUCTURE AND METHOD FOR CONTROLLING ELECTROSTATIC DISCHARGE (ESD) EVENT IN RESISTOR-CAPACITOR CIRCUIT

TECHNICAL FIELD

Embodiments of the disclosure relate generally to electronic circuits. More specifically, various embodiments of the disclosure provide a circuit structure and method for controlling an electrostatic discharge (ESD) event in a resistor-capacitor circuit.

BACKGROUND

Electric circuits, including integrated circuits (ICs), may include elements for protecting the device hardware against electrostatic discharge (ESD) voltages that can cause electrical shorts, dielectric breakdown, and/or other failure modes. In an ideal setting, ESD elements have no effect on the device operation until an ESD event is seen by a pin on an IC where the ESD event acts as a trigger voltage, which turns on the ESD devices and discharges current through the ESD element to power, or ground supply rails. ESD elements may serve no operational purpose until a trigger voltage is applied to the ESD element to activate it. As the requirements for low leakage and longer battery life continue to increase, the typical power clamp using a large FET as a discharge element is often too leaky. A different problem frequently arises when replacing the large FET with a "snapback device" to solve the leakage issue. A snapback device refers to a specific genus of devices in which the current flow, once enabled, might remain turned on even after the application of a signal to a gate terminal of the snapback device (i.e., "latchup"). Conventional configurations for ESD elements and/or other structures have been unable to provide stable trigger voltages while also preventing latchup to ensure that the ESD element is only active during an ESD event.

SUMMARY

Aspects of the present disclosure provide a circuit structure including: a resistor-capacitor (RC) circuit having a first node, a second node separated from the first node by a resistive element and a capacitive element, and a third node between the resistive element and the capacitive element; a trigger transistor having a pair of source/drain (S/D) terminals coupled between the first node and the second node in parallel with the RC circuit, and a gate terminal coupled to the third node of the RC circuit; a mirror transistor having a pair of S/D terminals coupled between the first node and the second node in parallel with the RC circuit, and a gate terminal coupled to the gate terminal of the trigger transistor, wherein the pair of S/D terminals of the mirror transistor are configured to transmit a current that is less than a current through the pair of S/D terminals of the trigger transistor; and a snapback device having a gate terminal coupled to a selected one of the pair of S/D terminals of the mirror transistor, and a pair of anode/cathode terminals coupled between the first node and the second node in parallel with the RC circuit, wherein a current at the gate terminal of the snapback device controls an anode/cathode current flow in the snapback device.

Further aspects of the present disclosure provide a circuit structure including: a resistor-capacitor (RC) circuit having a first node, a second node separated from the first node by a resistive element and a capacitive element, and a third node between the resistive element and the capacitive element; a trigger transistor having a pair of source/drain (S/D) terminals coupled between the first node and the second node in parallel with the RC circuit, and a gate terminal coupled to the third node of the RC circuit; a mirror transistor having a pair of S/D terminals coupled between the first node and the second node in parallel with the RC circuit, and a gate terminal coupled to the gate terminal of the trigger transistor, wherein a current through the pair of S/D terminals of the mirror transistor is less than a current through the pair of S/D terminals of the trigger transistor; and a snapback device having a gate terminal for controlling current flow in the snapback device, the snapback device including a P-well having a first N-doped region coupled to the first node, an N-well adjacent the P-well, and having a first P-doped region coupled to the the second node, wherein a current pathway from the first node to the second node through the snapback device is in parallel with the RC circuit, and at least one doped region within the P-well or the N-well coupled to a selected one of the pair of S/D terminals of the mirror transistor, and defining the gate terminal of the snapback device, wherein the at least one doped region has a same doping type with respect to the P-well or the N-well.

Additional aspects of the present disclosure provide a method for controlling an electrostatic discharge (ESD) event in a resistor-capacitor (RC) circuit, the method including: transmitting an electrostatic discharge (ESD) current through a trigger transistor in parallel with a resistor-capacitor (RC) circuit, the RC circuit including a first node, a second node separated from the first node by a resistive element and a capacitive element, and a third node coupled to a gate of the trigger transistor between the resistive element and the capacitive element; transmitting a mirrored current through a mirror transistor in parallel with the trigger transistor, wherein the mirror transistor is configured to transmit a current that is less than the transmitted ESD current; and transmitting the mirrored current to a gate terminal of a snapback device electrically coupled between the first node and the second node in parallel with the RC circuit, to enable current flow from the first node to the second node through snapback device during the transmitting of the mirrored current to the gate terminal.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide a circuit structure and related method for controlling an electrostatic discharge (ESD) event, which reliably triggers in response to an ESD event without posing a significant risk of latchup in a snapback device for routing ESD currents in parallel with a resistor-capacitor (RC) circuit. The RC circuit may include a first node, a second node separated from the first node by a resistive element and a capacitive element, and a third node between the resistive element and capacitive element. A trigger transistor with a pair of source/drain (S/D) terminals may be coupled between the first node and second node in parallel with the RC circuit, and the gate terminal of the trigger transistor is coupled to the third node of the RC circuit.

When an ESD event occurs, a resulting voltage in the RC circuit will enable current flow through the trigger transistor in parallel with the RC circuit. The circuit includes a mirror transistor with a gate terminal that is coupled to the gate terminal of the trigger transistor, and source/drain terminals that are coupled in parallel with the RC circuit. The mirror transistor, however, may be configured to transmit a much smaller current than the trigger transistor (e.g., by being much smaller), and thus may replicate only a portion of the current through the trigger transistor. A snapback device, i.e., an electrical element in which current flow between anode and cathode terminals is enabled only during application of voltage to its gate terminal ("$T_{Gate}$"), is coupled to one S/D terminal of the mirror transistor. The anode/cathode terminals of the snapback device are coupled in parallel with the RC circuit. By adjusting the ratio of the trigger device current to the mirror device current, it is possible to modulate the total amount of current required to trigger the clamp ("$I_{trigger}$"). Thus, the circuit can be electrically configured with a high $I_{trigger}$ value to avoid a mis-triggering of the clamp.

Figure 1:
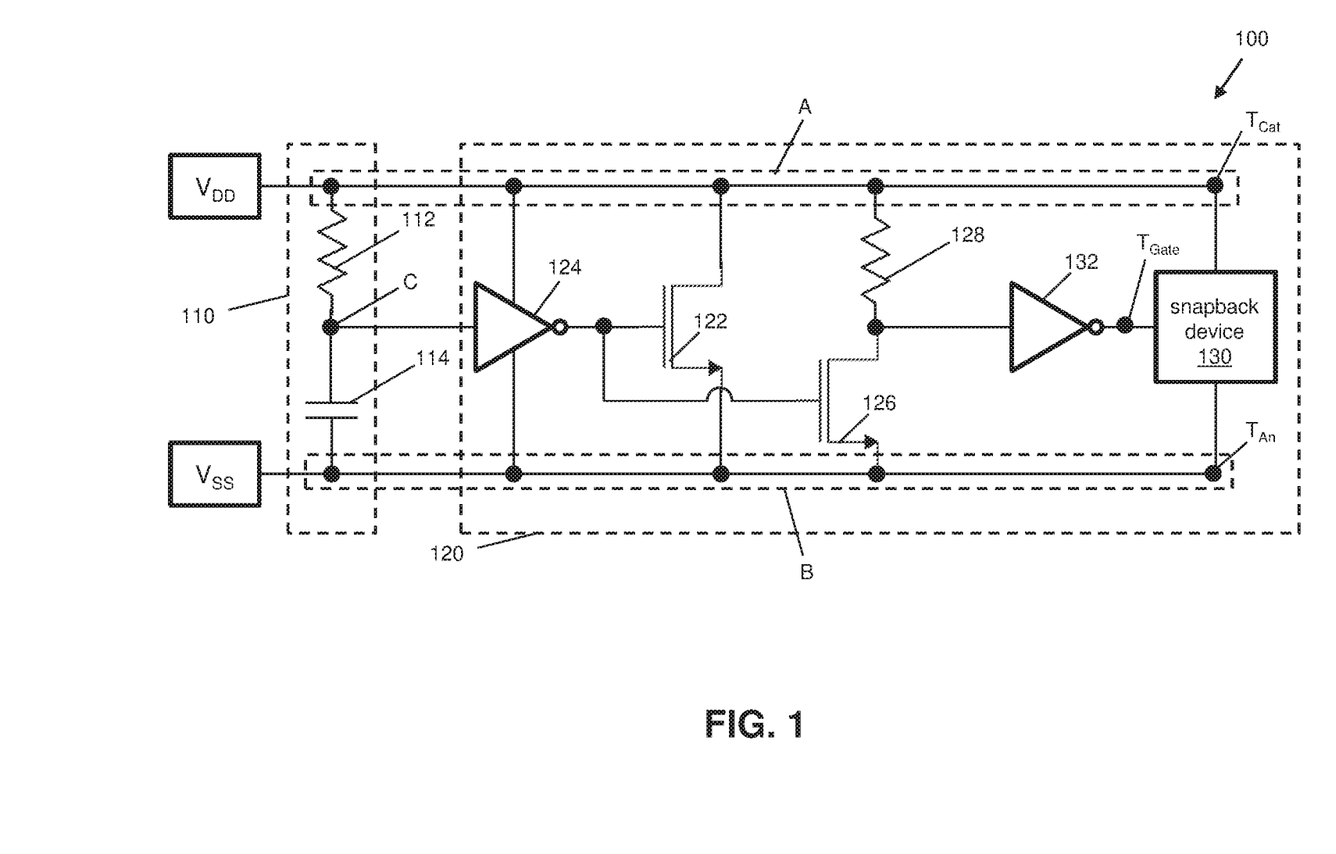
FIG. 1 provides a schematic view of a circuit structure for controlling an electrostatic discharge (ESD) event according to embodiments of the disclosure.

Referring to FIG. 1, a schematic view of a circuit structure (simply "structure" hereafter) 100 according to embodiments of the disclosure is shown. Structure 100 may be embodied as any type of electronic circuit and in various implementations may be provided in the form of, or included as part of, an integrated circuit (IC) structure. Structure 100 may include, or otherwise may be coupled to, opposing terminals of a resistor-capacitor (RC) circuit 110, alternatively known as an "RC filter" or "RC network" in various settings. RC circuit 110 may include many electrically active elements including several resistors, capacitors, diodes, and/or other devices. Regardless of structure or function, RC circuit 110 may be schematically depicted using two electrical components: a resistive element 112 and a capacitive component 114 connected in series between an input terminal ("$V_{DD}$") indicating, e.g., a connection to a power supply and an output terminal ("$V_{SS}$") indicating, e.g., a connection to ground. A first node A may indicate the "high voltage" terminal of RC circuit 110, and a second node B may indicate the opposite "low voltage" or "ground" terminal of RC circuit 110. Multiple features of structure 100 may be coupled between nodes A and B in parallel with RC circuit 110 as discussed herein. A third node C may designate the junction between resistive component 112 and capacitive component 114 within RC circuit 110. Third node C may be used to control the operation of structure 100, e.g., to react to spikes in electrical current during an ESD event as discussed herein. Structure 100 is configured to react to excess charges and currents originating from an ESD event by preventing current flow into active components (e.g., RC circuit 110). Input terminal $V_{DD}$ may electrically couple an input voltage and/or signal to RC circuit 110 via any form of wiring. Excess charge created by an ESD event may be transmitted to structure 100 via input terminal $V_{DD}$.

Structure 100 may take the form of a clamp configured to short such excess charges from power to ground through output terminal $V_{SS}$. It is understood that the $V_{DD}$ and $V_{SS}$ designations for input and outputs of structure 100 and RC circuit 110 may be switched in further implementations. Structure 100 is designed to not operate under non-ESD conditions with variations in voltage. In particular, structure 100 remains inactive during power up and power down operations where voltages may fluctuate, when such voltage fluctuations are insufficient to trigger the transistor gate(s) of its components. Structure 100 thus is designed to selectively allow current flow only upon detecting an ESD event.

A set of ESD elements 120 may be coupled between first node A and second node B in parallel with RC circuit 110, with portions of ESD elements 120 being coupled to third node C. ESD elements 120 may be selectively activated during an ESD event, by responding to voltages or currents that are higher than intended for RC circuit 110. ESD element(s) 120 may prevent current flow from input terminal $V_{DD}$ to output terminal $V_{SS}$ unless, or until a trigger voltage is applied to a trigger transistor 122 of ESD element(s) 120. In various other examples, additional circuitry and/or current paths may be located between RC circuit 110 and ESD elements 120, to further control the circumstances in which ESD elements 120 become electrically active.

ESD elements 120 of structure 100 may include several transistors, each configured to react to control the flow of current through ESD elements 120 during an ESD event. A transistor refers to an electrical component in which a flow of current between input and output nodes (e.g., source and drain terminals) is controlled by the voltage applied to a third "gate" terminal. Trigger transistor 122 may be coupled at its gate to third node C of RC circuit 110, such that an operational current or voltage of RC circuit 110 controls whether trigger transistor 122 is on or off. Trigger transistor 122 may be coupled to RC circuit 110 through a first inverter 124 serially coupled between third node C and the gate of trigger transistor 122. Inverter 124 may convert the voltage at third node C to its opposite polarity (e.g., negative to positive or vice versa). First inverter 124 may also be coupled to nodes A, B in parallel with RC circuit 110, to electrically power its inverting function in structure 100. First inverter 124 may operate in tandem with other inverters of ESD elements 120 for electrical stability and/or to intentionally delay the time needed for structure 100 to respond to an ESD event. In further embodiments, first inverter 124 may be omitted and/or replaced with multiple inverters. In any case, the electrical coupling from third mode C to the gate of trigger transistor 122 may cause spikes in voltage to activate trigger transistor 122.

The gate of trigger transistor 122 may be coupled to the gate terminal of a mirror transistor 126. Mirror transistor 126 may include source and drain terminals coupled between first node A and second node B of structure 100, in parallel with trigger transistor 122. Mirror transistor 126, by being coupled at its gate to the gate of trigger transistor 126, may act as a "current mirror" in which the source-drain current within mirror transistor 126 is proportionate by a fixed multiple to the source/drain current within trigger transistor 122. A current mirror refers to any circuit structure configured to copy the current through one device (e.g., the current through trigger transistor 122) in another device by its exact amount, or by a factor between zero and one. A resistor 128 may be coupled between first node A and the source or drain terminal of mirror transistor 126, e.g., to further reduce the voltage at the source or drain of mirror transistor 126 as compared with voltage level $V_{DD}$. Mirror transistor 126 may have a substantially lower flow than is allowed through trigger transistor 122, e.g., to reduce leakage current within active components (e.g., a snapback device 130, discussed herein) of structure 100 that are coupled to mirror transistor 126. Mirror transistor 126 may have a source-to-drain width that is substantially smaller than trigger transistor 122. In such an example, mirror transistor 126 may carry at most $1/10^{th}$ of the current within trigger transistor 122. In further examples, trigger transistor 122 may carry a current of at most approximately two-hundred milliamperes (mA), while mirror transistor 126 may carry a current of at most approximately twenty mA. In yet another example, the source-to-drain width of trigger transistor 122 may be approximately two-hundred micrometers (μm), while the source-to-drain width of mirror transistor 126 may be approximately ten μm (i.e., about twenty times smaller).

The source or drain of mirror transistor 126 may be coupled to second node B, thereby providing another parallel current pathway with respect to RC circuit 110 and trigger transistor 122. The other source or drain terminal of mirror transistor 126 may be coupled to a gate terminal $T_{Gate}$ of snapback device 130. Similar to trigger transistor 122, ESD element(s) 120 may include at least one second inverter 132 coupled between gate terminal $T_{Gate}$ of snapback device 130 and mirror transistor 126. Second inverter 132, which may include the same type of inverter as first inverter 124 and/or a similar structure, may invert the voltage polarity between the gate of mirror transistor 126 and $T_{Gate}$ of snapback device 130, e.g., for further stability and/or protection against false positive ESD voltages. The electrical coupling between trigger transistor 122 and mirror transistor 126, itself, may operate as a third inverter between first inverter 124 and second inverter 132, thereby causing an opposite polarity but smaller magnitude voltage at gate terminal $T_{Gate}$ of snapback device 130. As noted elsewhere herein, second inverter 132 may include multiple additional inverters and/or may be omitted in entirely in alternative configurations.

Snapback device 130, additionally, may include a cathode terminal $T_{Cat}$ coupled to first node A and an anode terminal $T_{An}$ coupled to second node B in parallel with RC circuit 110. The term "snapback device" refers to a three-terminal electrical element defining an electrical pathway from cathode terminal to anode terminal, with a gate terminal in electrical communication with the cathode and anode terminals. Applying a relatively small input current to the gate terminal enables current flow from cathode to anode. A silicon-controlled rectifier (SCR) is a commonly implemented type of snapback device, as an SCR may include multiple doped semiconductor regions of varying polarity and concentration. An SCR may be particularly effective for use as snapback device 130 in structure 100, due to its ease of integration into semiconductor material(s) having other structures/devices formed therein. Further types of elements suitable to form snapback device 130 may include, e.g., bidirectional thyristors or other thyristor-based protective devices (TSPDs), gas discharge tubes (GDTs), bipolar transistors having avalanche junctions, and/or other electrical elements having similar properties.

Figure 2:
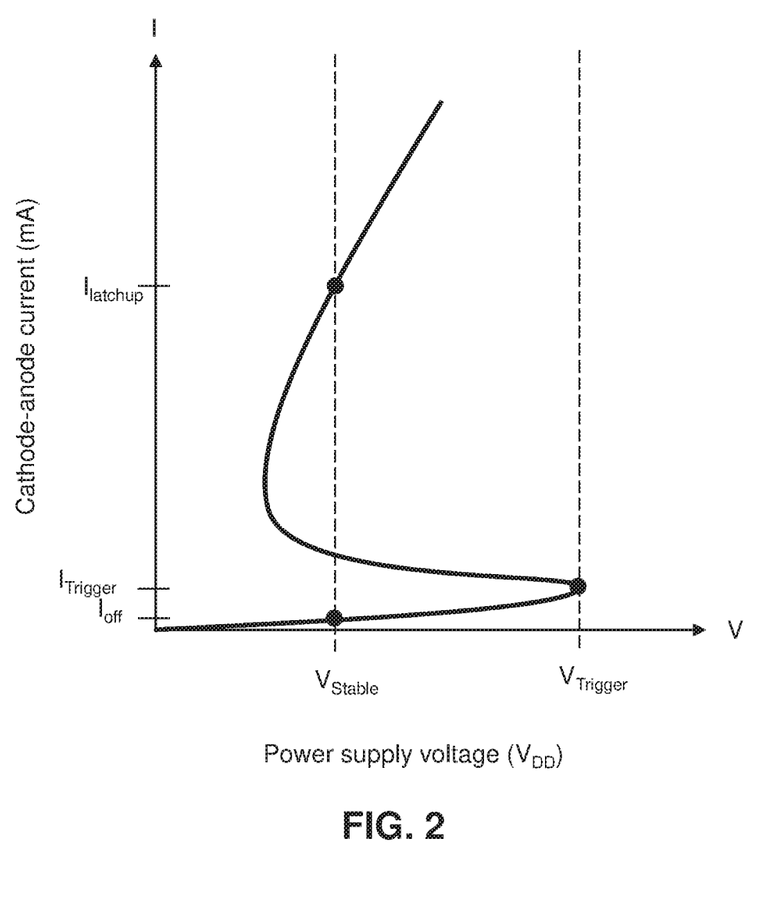
FIG. 2 shows an illustrative plot of current versus gate voltage of a snapback device during operation of embodiments of the disclosure.

Referring briefly to FIG. 2, a plot of cathode-anode current (variable I, measured in mA) versus power supply voltage (variable $V_{DD}$, measured in volts (V)) for snapback device 130 is shown according to an example implementation to better illustrate the behavior of structure 100. During non-ESD operation of RC circuit 110, a non-ESD voltage ("$V_{Stable}$") may be applied to opposite RC circuit 110 without triggering ESD element(s) 120. In this state, substantially no current may reach gate terminal $T_{Gate}$ and thus substantially no current flows from cathode to anode in snapback device 130 (i.e., snapback device 130 exhibits current $I_{off}$). As power supply voltage $V_{DD}$ increases from an ESD event, snapback device may enable current to flow from cathode to anode (e.g., snapback device 130 exhibits a non-zero current $I_{on}$) as it diverts the overflow current from first node A. A trigger voltage $V_{trigger}$ may indicate the ESD voltage at which ESD element(s) 120 will trigger (i.e., cathode-to-anode current is enabled) while $I_{trigger}$ may indicate the ESD voltage at which ESD element(s) 120 will trigger. If the ESD current reaches or exceeds $V_{trigger}$, snapback device 130 will revert to a state in which cathode-to-anode current flow is currently enabled (i.e., latchup). In this state, snapback device 130 would permanently exhibit a higher current $I_{latchup}$ even during non-ESD operation. Embodiments of the disclosure avoid or prevent this issue through the inclusion of mirror transistor 126 (FIG. 1). To allow mirror transistor 126 to drive enough current to trigger snapback device 130 through the biasing of gate terminal ($T_{Gate}$), trigger transistor 122 may be provided with a substantially larger current. Thus, by configuring circuit 100 for a particular current mirror ratio, the trigger current $I_{trigger}$ value can be modulated. As an example, where triggering of snapback device 130 requires 5 mA of current from mirror device 126, trigger device 122 may drive 200 mA, which may raise $I_{trigger}$ in excess of 205 mA.

Figure 3:
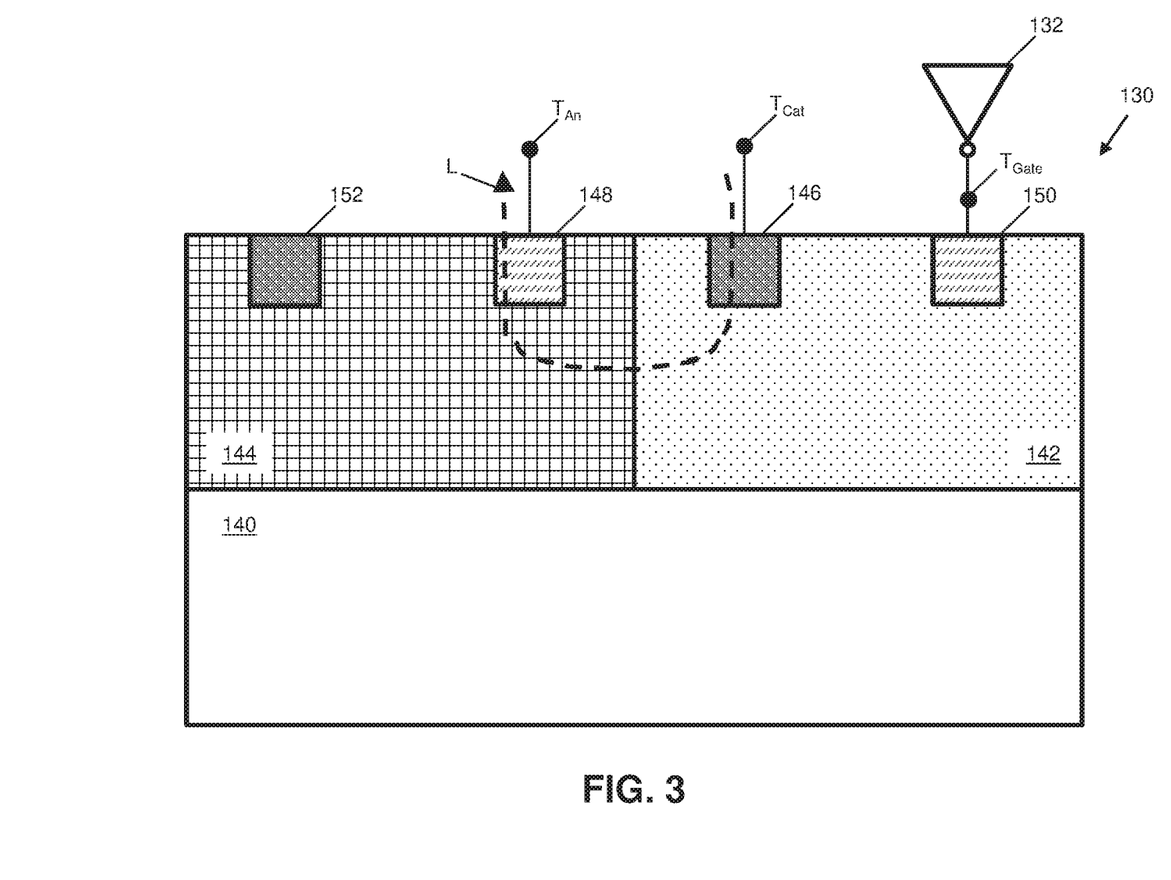
FIG. 3 shows a cross-sectional view of a snapback device within a circuit structure according to embodiments of the disclosure.

Turning to FIGS. 1 and 3, further example subcomponents of snapback device 130 are discussed. Here, snapback device 130 may take the form of an SCR. Snapback device 130 may be formed from a substrate 140 including, e.g., one or more semiconductor materials. Substrate 140 can include any currently known or later-developed semiconductor material, which may include without limitation, silicon, germanium, silicon carbide, and those including essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 140 or a portion thereof may be strained.

Various portions of substrate 140 may be doped, based on the intended polarity and/or intended characteristics of snapback device 130 and/or other device structures formed thereon, to form a P-well 142 and an N-well 144 adjacent P-well 142. P-well is shown in an example as being to the right of N-well 142 and being of approximately equal size, but this is not necessarily required. Various active elements may be formed on or within P-well 142 and/or N-well 144, to form electrical pathways through snapback device 130, electrically bias and/or influence current flow through well(s) 142, 144, etc., without fundamentally changing the function of active elements and/or affecting other structures formed over or within substrate 140. In some implementations (e.g., semiconductor on insulator (SOI)) structures, one or more layers of dielectric or other insulating materials may be located between vertically between substrate 140 and either or both of wells 142, 144.

A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. Doped portions of a substrate may be known in the art as a "well." A well commonly refers to the implanted/diffused region in semiconductor wafer needed to implement complementary metal oxide semiconductor (CMOS) cell. A "deep well" refers to doped semiconductor material located underneath active device components and/or other wells. Depending on the attributes of a device to be manufactured, portions of semiconductor material on or over substrate 140 may be either N-type or P-type doped as discussed herein.

Wells 142, 144 may be doped with additional materials to a greater concentration than well(s) 142, 144, and of different doping types, to yield the functions of snapback device 130 during operation. For instance, P-well 142 may have a first N-doped region 146 coupled to first node A, which may be the same node as and/or may include cathode terminal Teat. N-doped region 146 thus may have opposite doping type from P-well 142. N-well 144 similarly may have a first P-doped region 148 coupled to second node B, which may be the same node as and/or may include anode terminal $T_{An}$. Portions of each well 142, 144 may physically separate first N-doped region 146 from first P-doped region 148. The arrangement of alternating doped regions within snapback device 130 provides a current pathway L from cathode terminal $T_{Cat}$ to anode terminal $T_{An}$ through snapback device 130.

Snapback device 130 may include a first doped region 150 and/or a second doped region 152 within P-well 142 and N-well 144, respectively, to provide a gate contact for controlling current flow along current pathway L. Each doped region 150, 152 may be of the same doping type from its corresponding well 142, 144 and may include or otherwise may be coupled to gate terminal $T_{Gate}$. Here, first doped region 150 may be doped P-type and within P-well 142, while second doped region 152 may be doped N-type and within N-well 142. Where applicable, doped region(s) 150, 152 may be coupled to the output of second inverter 132. The electrical coupling to second doped region 152 is shown in phantom to indicate that it may be an additional coupling, or alternative coupling, with respect to first doped region 150. Transmitting a current to doped region(s) 150, 152 of snapback device may electrically bias well(s) 142, 144 and concurrently enable current flow through current pathway L.

Figure 4:
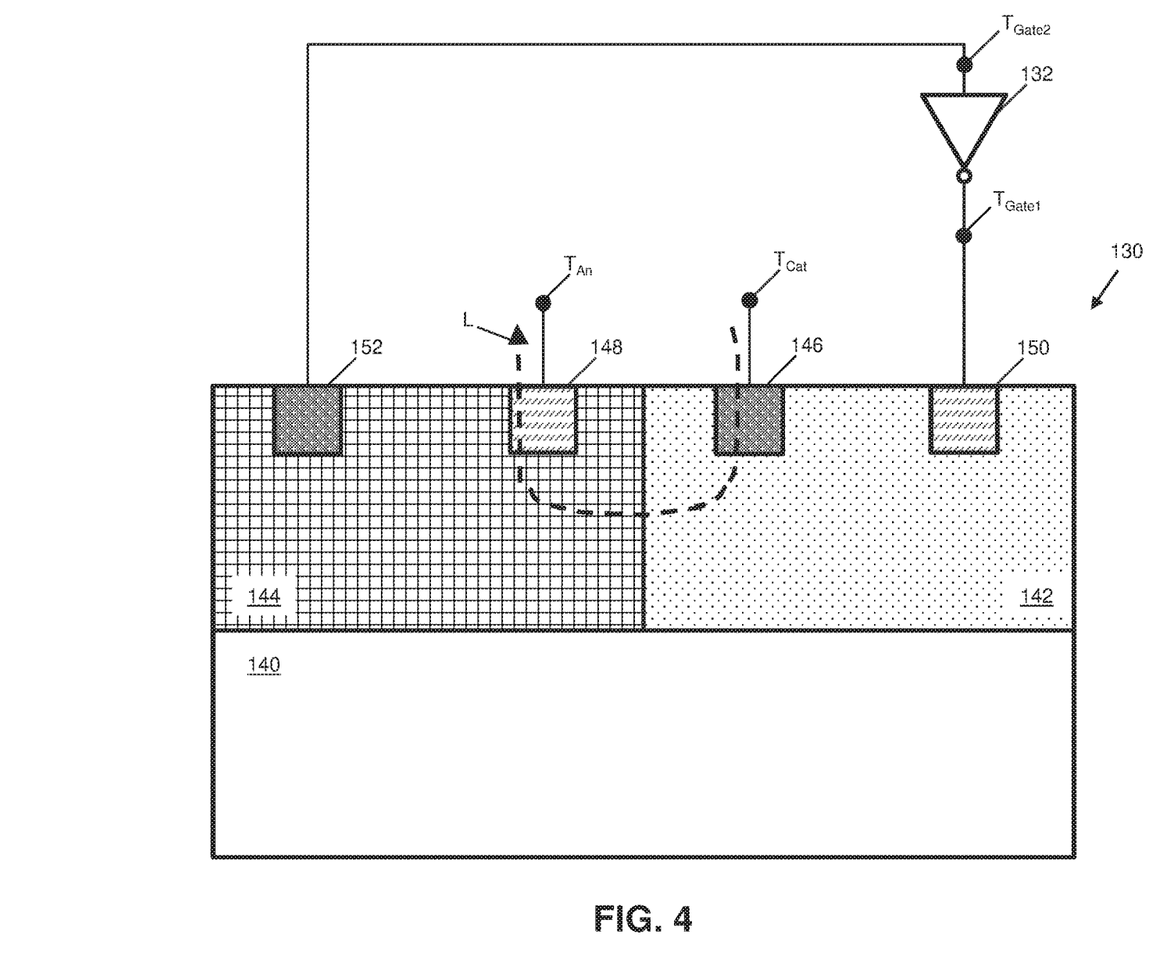
FIG. 4 shows a cross-sectional view of a snapback device within a circuit structure according to further embodiments of the disclosure.

Referring briefly to FIG. 4, further embodiments of snapback device 130 may include multiple doped regions, coupled to opposite polarity voltages for stronger control over current flow through current pathway L. In such cases, snapback device 130 may have two gates $T_{Gate1}$ and $T_{Gate2}$ that may be coupled to first doped region 150 and second doped region 152. In this case, doped regions 150, 152 each may be electrically coupled to the input and output of second inverter 132. In some configurations, the polarity of each gate terminal $T_{Gate1}$ and $T_{Gate2}$ relative to second inverter 132 may be reverse. Through such a connection, applying a single voltage to gate terminals $T_{Gate1}$ and $T_{Gate2}$ may produce electric currents to each doped region 150, 152 to electrically bias N-well 142 and P-well 144 simultaneously, with opposite voltage polarities. This may further control leakage and turn-on of snapback device 130.

Referring again to FIGS. 1 and 3, methods according to the disclosure may include using structure 100 during operation of a device to control ESD events to protect RC circuit 110 from excessive electric currents. Methods according to the disclosure may include, e.g., transmitting an ESD current through trigger transistor 122 of ESD element(s) 120 in parallel with RC circuit 110. The ESD current may arise from an ESD event in one or more devices interconnected with structure 100. Transmitting such a current through trigger transistor 122 will cause mirror transistor 126 to also receive a mirrored current in parallel with trigger transistor 122, but such a current is lower than the current in trigger transistor 122. The reduced current in mirror transistor 126 is attributable to, e.g., mirror transistor 126 being significantly smaller (e.g., having a lower source-to-drain width as discussed herein) and/or due to the presence of resistor 128, where applicable. In an example implementation, the mirrored current in mirror transistor 126 may be at most approximately $\frac{1}{10}^{th}$ of the current in trigger transistor 122. The mirrored current in mirror transistor 126 may be routed to gate terminal $T_{Gate}$ of snapback device 130, thereby enabling a cathode-to-anode current flow along current pathway J (FIG. 2). While active, snapback device 130 electrically shorts the ESD current to bypass RC circuit 110. The time lag between the activation of trigger transistor 122 and the enabling of snapback device 130 may be insignificantly small (e.g., approximately hundred picoseconds (ps)), to prevent any effect of ESD currents on RC circuit 110 and on the integrated circuit.

The descriptions of the various embodiments of the present disclosure have been presented for purposes of illustration, but are not intended to be exhaustive and/or limited to the embodiments disclosed. Many modifications and variations will be apparent to those of ordinary skill in the art within the scope and spirit of the described embodiments The terminology used herein was chosen to best explain the principles of the embodiments, the practical application and/or technical improvement over technologies found in the marketplace, and/or to enable others of ordinary skill in the art to understand the embodiments disclosed herein.

Embodiments of the disclosure may provide several technical and commercial advantages, some of which are discussed by example herein. Embodiments of structure 100 provide, e.g., a structure capable of responding to ESD events with conventional trigger voltage magnitudes, while reducing the current or voltage necessary to enable electrical shorting through snapback device 130. Embodiments of the disclosure, moreover, prevent the gate voltage of snapback device 130 from approaching any level that poses a risk of "latchup" and permanent electrical shorting of RC circuit 110. In some cases, the size and electrical parameters of trigger transistor 122 and/or mirror transistor 126 may be selected to accommodate different types of RC circuits 110 and/or devices that are electrically coupled to structure 100. As compared to conventional structures for responding to ESD events that affect RC circuit 110, embodiments of structure 100 occupy a similar or reduced surface area to other circuits to temporarily bypass RC circuit 110.

What is claimed is:

1. A circuit structure comprising:
   a resistor-capacitor (RC) circuit having a first node, a second node separated from the first node by a resistive element and a capacitive element, and a third node between the resistive element and the capacitive element;
   a trigger transistor having a pair of source/drain (S/D) terminals coupled between the first node and the second node in parallel with the RC circuit, and a gate terminal coupled to the third node of the RC circuit;
   a mirror transistor having a pair of S/D terminals coupled between the first node and the second node in parallel with the RC circuit, and a gate terminal coupled to the gate terminal of the trigger transistor, wherein the pair of S/D terminals of the mirror transistor are configured to transmit a current that is less than a current through the pair of S/D terminals of the trigger transistor;
   a resistor coupled between a selected one of the pair of S/D terminals of the mirror transistor and the first node, wherein the resistor is configured to transmit the current through the mirror transistor; and
   a snapback device having a gate terminal coupled to the selected one of the pair of S/D terminals of the mirror transistor, and a pair of anode/cathode terminals coupled between the first node and the second node in parallel with the RC circuit, wherein a current at the gate terminal controls an anode/cathode current flow in the snapback device.

2. The circuit structure of claim 1, further comprising:
   a first inverter having an input coupled to the third node of the RC circuit, and an output coupled to the gate terminal of the trigger transistor; and
   a second inverter having an input coupled to the selected one of the pair of S/D terminals of the mirror transistor, and an output coupled to the gate terminal of the snapback device,
   wherein the trigger transistor and the mirror transistor are configured to invert a voltage polarity between the output of the first inverter and the input of the second inverter.

3. The circuit structure of claim 1, wherein the current through the pair of S/D terminals of the mirror transistor is at most $\frac{1}{10}^{th}$ of the current through the pair of S/D terminals of the trigger transistor.

4. The circuit structure of claim 1, wherein the current through the pair of S/D terminals of the mirror transistor is at most approximately twenty milliamperes (mA), and the current through the pair of S/D terminals of the trigger transistor is at most approximately two hundred mA.

5. The circuit structure of claim 1, wherein a source-to-drain width of the trigger transistor is at most approximately four thousand micrometers ($\mu$m), and a source-to-drain width of the mirror transistor is at most approximately two hundred $\mu$m.

6. The circuit structure of claim 1, wherein the snapback device includes a silicon-controlled rectifier (SCR).

7. A circuit structure comprising:
   a resistor-capacitor (RC) circuit having a first node, a second node separated from the first node by a resistive element and a capacitive element, and a third node between the resistive element and the capacitive element;
   a trigger transistor having a pair of source/drain (S/D) terminals coupled between the first node and the second node in parallel with the RC circuit, and a gate terminal coupled to the third node of the RC circuit;
   a mirror transistor having a pair of S/D terminals coupled between the first node and the second node in parallel with the RC circuit, and a gate terminal coupled to the gate terminal of the trigger transistor, wherein a current through the pair of S/D terminals of the mirror transistor is less than a current through the pair of S/D terminals of the trigger transistor;
   a resistor coupled between a selected one of the pair of S/D terminals of the mirror transistor and the first node, wherein the resistor is configured to transmit the current through the mirror transistor; and
   a snapback device having a gate terminal for controlling current flow the snapback device, the snapback device including:
     a P-well having a first N-doped region coupled to one of the first node,
     an N-well adjacent the P-well, and having a first P-doped region coupled to the second node, wherein a current pathway from the first node to the second node through the snapback device is in parallel with the RC circuit, and
     at least one doped region within the P-well or the N-well coupled to the selected one of the pair of S/D terminals of the mirror transistor, and defining the gate terminal of the snapback device, wherein the at least one doped region has a same doping type with respect to the P-well or the N-well.

8. The circuit structure of claim 7, further comprising:
   a first inverter having an input coupled to the third node of the RC circuit, and an output coupled to the gate terminal of the trigger transistor; and
   a second inverter having an input coupled to the selected one of the pair of S/D terminals of the mirror transistor, and an output coupled to the gate terminal of the snapback device, wherein the trigger transistor and the mirror transistor are configured to invert a voltage polarity between the output of the first inverter and the input of the second inverter.

9. The circuit structure of claim 7, wherein the current through the pair of S/D terminals of the mirror transistor is at most $\frac{1}{10}^{th}$ of the current through the pair of S/D terminals of the trigger transistor.

10. The circuit structure of claim 7, wherein the current through the pair of S/D terminals of the mirror transistor is at most approximately twenty milliamperes (mA), and the current through the pair of S/D terminals of the trigger transistor is at most approximately two hundred mA.

11. The circuit structure of claim 7, wherein a source-to-drain width of the trigger transistor is at most approximately four thousand micrometers (μm), and a source-to-drain width of the mirror transistor is at most approximately two hundred μm.

12. The circuit structure of claim 7, wherein the snapback device includes a silicon-controlled rectifier (SCR).

13. The circuit structure of claim 12, wherein at least one doped region within the P-well or the N-well includes a second P-doped region within the P-well and a second N-doped region within the N-well.

14. A method for controlling an electrostatic discharge (ESD) event in a resistor-capacitor (RC) circuit, the method comprising:
    transmitting an electrostatic discharge (ESD) current through a trigger transistor in parallel with a resistor-capacitor (RC) circuit, the RC circuit including a first node, a second node separated from the first node by a resistive element and a capacitive element, and a third node coupled to a gate of the trigger transistor between the resistive element and the capacitive element;
    transmitting a mirrored current through a mirror transistor in parallel with the trigger transistor via a resistor coupled between the first node and a source terminal or drain terminal of the mirror transistor, wherein the mirror transistor is configured to transmit a current that is less than the transmitted ESD current; and
    transmitting the mirrored current to a gate terminal of a snapback device electrically coupled between the first node and the second node in parallel with the RC circuit, to enable current flow from the first node to the second node through snapback device during the transmitting of the mirrored current to the gate terminal.

15. The method of claim 14, wherein transmitting the mirrored current includes preventing the mirrored current from exceeding approximately most $\frac{1}{10}^{th}$ of the transmitted ESD current.

16. The method of claim 14, wherein transmitting the ESD current includes preventing the ESD current from exceeding approximately two hundred milliamperes (mA), and transmitting the mirrored current includes preventing the mirrored current from exceeding approximately twenty milliamperes (mA).

17. The method of claim 14, further comprising applying an inverted node voltage within the RC circuit to a gate terminal of the trigger transistor, to transmit the ESD current through the trigger transistor, and wherein transmitting the mirrored current to the gate terminal of the snapback device includes applying an inverse of a source/drain voltage of the mirror transistor to the gate terminal of the snapback device.

18. The method of claim 14, wherein the snapback device includes a silicon-controlled rectifier (SCR).

\* \* \* \* \*